(12) United States Patent
Zaech et al.

(10) Patent No.: US 7,081,166 B2
(45) Date of Patent: *Jul. 25, 2006

(54) PLANETARY SYSTEM WORKPIECE SUPPORT AND METHOD FOR SURFACE TREATMENT OF WORKPIECES

(75) Inventors: Martin Zaech, Balzers (LI); Anton Kunz, Triesenberg (LI)

(73) Assignee: Unaxis Balzers Aktiengesellschaft, Balzers (LI)

( * ) Notice: Subject to any disclaimer, the term of this patent is extended or adjusted under 35 U.S.C. 154(b) by 166 days.

This patent is subject to a terminal disclaimer.

(21) Appl. No.: 10/601,734

(22) Filed: Jun. 23, 2003

(65) Prior Publication Data

US 2005/0072266 A1  Apr. 7, 2005

Related U.S. Application Data (63) Continuation of application No. 09/879,527, filed on Jun. 12, 2001, now Pat. No. 6,620,254, which is a continuation of application No. PCT/CH99/00602, filed on Dec. 15, 1999.

(30) Foreign Application Priority Data

Dec. 15, 1999  (CH) ..................... 2477/98

(51) Int. Cl.
C23C 16/00 (2006.01)
C23C 13/08 (2006.01)

(52) U.S. Cl. .................... 118/728; 156/345.55

(58) Field of Classification Search ............... 118/500, 118/728, 730; 475/11, 332, 331, 903; 216/67; 156/345.55; 204/199, 212; 427/240, 345.55, 427/481; 901/41

See application file for complete search history.

(56) References Cited

U.S. PATENT DOCUMENTS

| 3,598,083 | A |   | 8/1971  | Dort et al. |
| 3,853,091 | A |   | 12/1974 | Christensen et al. |
| 3,926,421 | A | * | 12/1975 | Reiger et al. .................. 269/57 |
| 4,087,239 | A | * | 5/1978  | Cline et al. .................. 432/124 |
| 4,284,033 | A | * | 8/1981  | del Rio ....................... 118/730 |
| 5,029,555 | A | * | 7/1991  | Dietrich et al. ............. 118/730 |
| 5,902,407 | A | * | 5/1999  | deBoer et al. ............... 118/725 |
| 6,620,254 | B1 | * | 9/2003  | Zaech et al. ................. 118/730 |

OTHER PUBLICATIONS

EPO—Patent Abstracts of Japan—Publ. No. 01133318—Publ. Date May 25, 1989.
EPO—Patent Abstracts of Japan—Publ. No. 01133320—Publ. Date May 25, 1989.
EPO—Patent Abstracts of Japan—Publ. No. 01309967—Publ. Date Dec. 14, 1989.

* cited by examiner

Primary Examiner—Parviz Hassanzadeh
Assistant Examiner—Sylvia R. MacArthur
(74) Attorney, Agent, or Firm—Notaro & Michalos PC (57) ABSTRACT

A planet system workpiece support for a vacuum treatment apparatus includes a sun system rotatable in the vacuum treatment apparatus about a sun system axle to be coupled to a drive. At least one planet system is rotatable on planet axle and is supported on the sun system. The planet system has a driving coupling for driving the planet system and the support has at least one moon system supported on the planet system and rotatable about a moon axle with a driving connection to the sun system. At least one workpiece is received on the moon system and the driving connection is established, at least during operation, uninterruptedly between sun system and moon system.

10 Claims, 8 Drawing Sheets

PLANETARY SYSTEM WORKPIECE SUPPORT AND METHOD FOR SURFACE TREATMENT OF WORKPIECES

CROSS-REFERENCE TO RELATED APPLICATIONS

This is a continuation of application Ser. No. 09/879,527 filed Jun. 12, 2001, now U.S. Pat. No. 6,620,254, which was a continuation of international application PCT/CH99/00602 filed Dec. 15, 1999, which claimed priority on Swiss application 2477/98 filed Dec. 15, 1999, which priority claim is repeated here.

FIELD AND BACKGROUND OF THE INVENTION

The present invention relates to a planetary system workpiece support as well as a surface treatment method for workpieces.

It relates fundamentally to workpiece support engineering for vacuum treatment and, in particular, vacuum coating installations. The goal of workpiece support engineering is always to move the workpieces past treatment sources, such as in particular coating sources and etching sources, such that as uniform as possible a treatment effect, in particular coating thickness and coating quality is ensured on all surfaces to be treated of the workpieces.

In the not prior published Swiss Patent Application No. 2278/97 and 1736/98, of Sep. 25, 1997 and Aug. 25, 1998, respectively, a planetary system workpiece support is described which is structured as follows:

A first system is provided which can be coupled with an installation-side driving and which is rotatable about an axis with respect to the installation.

This first rotational system is denoted in the following as sun system.

With respect to the sun system a second rotational system is provided on the latter, with rotational axis offset and parallel with respect to that of the sun system, in the following referred to as planet system, whose rotational motions are generated through the releasable engagement on the reference system formed by the installation or the chamber.

On the planetary system is provided a third rotational system, referred to in the following as moon system, which is rotatably supported with rotational axis parallel to the planetary system and sun system axis. The workpieces are set into [motion] characteristic [of the moon system] on the moon systems.

Workpiece supports of this type with threefold rotational motion are applied, in particular, in the case of relatively small workpieces in order to guide them past treatment sources stationary on the installation, such as coating sources, and to treat them uniformly on all sides.

At the above described workpiece support configuration the moon systems are set intermittently into rotational motion. This takes place thereby that with the sun system rotational motion and the superimposed planetary rotational motion they are guided past stops, which, developed like springs, act onto a ratchet-like toothing on the moon system. Inertially sluggish moon systems run therein past the stops without rotation incrementation, which has correspondingly negative consequences for the uniform workpiece treatment. The jolt-like incremental rotational motion of the moon systems generally means that, especially with relatively short treatment times, in particular coating times of tools and correspondingly provided low treatment effect, respectively small layer thickness, negative effects on the treatment homogeneity on the workpieces result due to statistical fluctuations with respect to the resilient stop engagements and the orientation resulting therefrom of the substrates to the treatment sources.

SUMMARY OF THE INVENTION

The task of the present invention is to develop further said workpiece support and to eliminate therein said disadvantages. This is realized by a planet system workpiece support of the above described type through its development according to the invention wherein the driving connection between sun system and moon system is established such that it is uninterrupted and a continuous moon system rotational motion is realized. The driving connection is preferably realized as a forced driving connection such that the moon system is perforce set into rotational motion.

Preferred embodiments of the workpiece support configuration according to the invention and a treatment method for workpieces according to the invention are also claimed.

BRIEF DESCRIPTION OF THE DRAWINGS

In the following the invention will be explained by example in conjunction with figures which depict.

DESCRIPTION OF THE PREFERRED EMBODIMENTS

Figure 1:
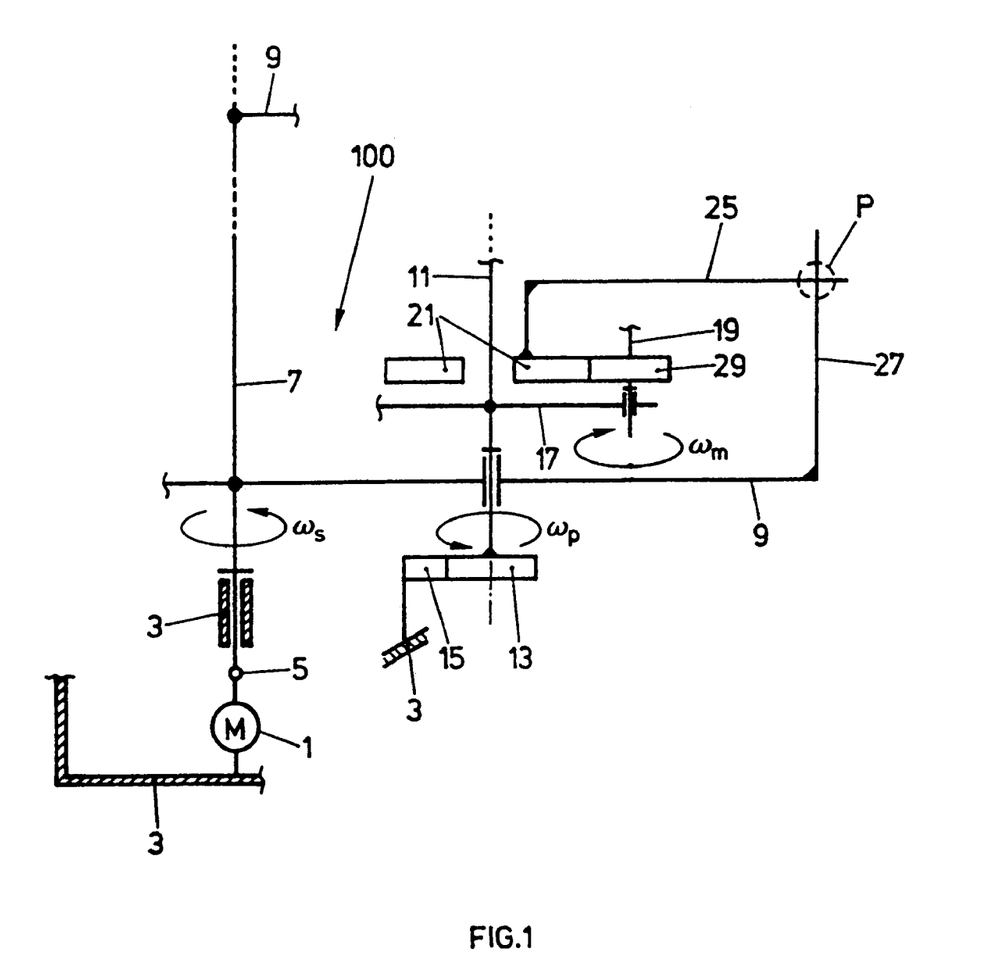
FIG. 1 schematically the principle and operational function of a first embodiment of a workpiece support according to the invention for carrying out the treatment method according to the invention, FIG. 2 simplified and in partially schematic view a section of a preferred realization of the workpiece support according to the invention, following the functional principle according to FIG. 1, FIG. 3 the engagement of a planet system part on a sun system part, realized as preferred in the embodiment according to FIGS. 1 and 2, FIG. 4 in a representation analogous to that of FIG. 1, the principle of a further embodiment of a workpiece support according to the invention, FIG. 5 in a representation analogous to FIG. 2, a section of a preferred realization of the workpiece support according to the invention, realized following the principle according to FIG. 4, FIG. 6 in a representation analogous to FIG. 1 or 4, a third fundamental realization variant of a workpiece support according to the invention, FIG. 7 in a representation analogous to FIG. 2 or 5, a section of a preferred realization of workpiece supports according to the invention, following the principle of FIG. 6, FIG. 8 in a representation analogous to FIG. 1 or 4 or 6, the principle of a further embodiment of workpiece supports according to the invention, FIG. 9 in a representation analogous to FIG. 2, 5 or 7, a section of a preferred realization of workpiece supports according to the invention, in accordance with the principle after FIG. 8, FIG. 10a a schematic representation of a further preferred driving connection between sun and planet system, and FIG. 10b schematically the configuration according to FIG. 10a in top view.

In FIG. 1 a first embodiment of a planet system workpiece support 100 is shown schematically, for reasons of clarity. A rotary drive 1 acts between a chamber wall 3, as a mechanical reference system of the configuration, and at least one workpiece support 100 according to the invention, releasably driving-coupled, such as via a coupling 5, with the drive 1. The rotary drive is conventionally disposed outside of the chamber with the chamber wall 3 and guided through with a vacuum-tight rotational through guide. The workpiece support 100 comprises a sun system axle 7, rotatably supported on the mechanical reference system 3. Under driving, this carries out the sun rotational motion $\omega_s$. On the at least one sun wheel 9, connected torsion-tight with the sun system axle 7, is rotationally supported one or several planet axles 11 parallel to the sun system axle 7. They are engaged via a planet drive wheel 13, preferably meshing via a toothed wheel, with a transfer ring 15, fixed with respect to the mechanical reference system 3, which ring 15 is disposed coaxially with the sun system axle 7.

Under rotational driving of the sun system about the sun system axle 7, the planet axle 11 experiences the planet rotation $\omega_p$.

On the at least one planet axle 11 at least one planet wheel 17 is disposed so as to be torsion-tight, on which, parallel to the planet axle 11, at least one moon axle 19 is rotatably supported. Freely rotationally movable with respect to the planet axle 11 and coaxially with it, is provided a transfer wheel 21, preferably transfer toothed wheel, which engages a moon drive wheel 29, torsion-tight on the moon axle 19, preferably developed as a toothed wheel.

On the transfer toothed wheel 21 is fastened a stop bracket 25, which, during its rotational motion about the planet axle 11, lastly comes into stop connection at P with a stop 27 on the sun system with sun wheel 9.

With planet rotation $\omega_p$ and corresponding rotation of the moon axle 19 about planet axle 11, the stop bracket 25 comes to a stop at stop 27, whereupon the moon drive wheel 29 is set into rotation. The moon system rotates with rotation $\omega_m$ uninterruptedly as long as the drive of the sun system is established.

On the moon system a workpiece holder is provided for at least one workpiece to be treated in the chamber.

Figure 2:
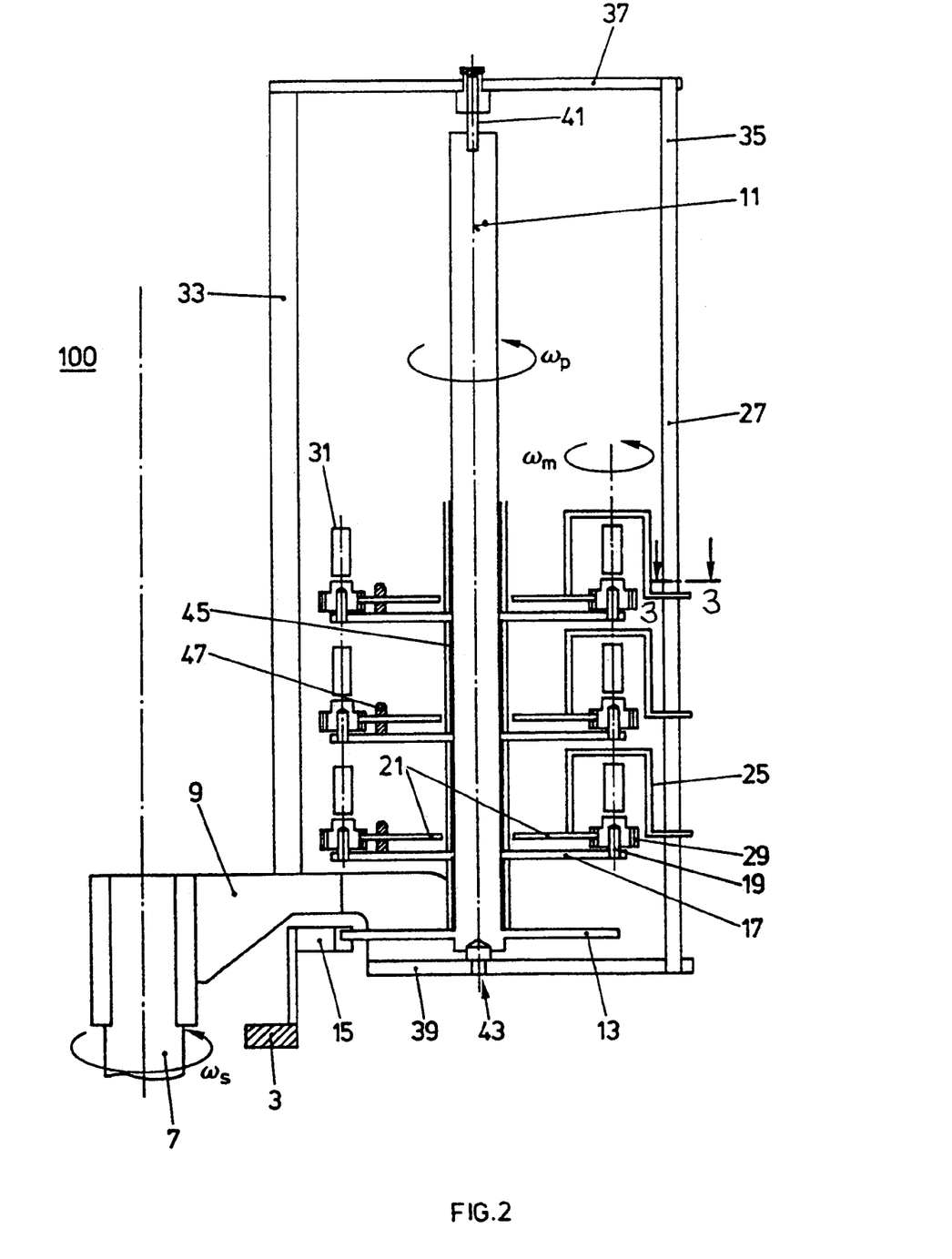

In FIG. 2 an implementation of the planet system according to the invention explained in principle in conjunction with FIG. 1. For parts, already explained in conjunction with FIG. 1, the same reference symbols are used. The operational function of the configuration according to FIG. 1, preferably realized as in FIG. 2, is readily evident based on the explanations in connection with FIG. 1.

Therein applies additionally: workpiece holders 31 are fastened on the moon axles 19. The sun system is structured as a cage with the sun wheel 9, longitudinal rods 33 and 35 as well as spokes 37 and 39. It is evident that the outer longitudinal rods 35 according to FIG. 1 act simultaneously as stop 27. The planet axles 11, as shown at 41, are supported at the top on pin bearings, which makes possible the ready removal or reinsertion of the particular planet system with the moon systems. For this purpose, the planet axles 11 are at the bottom preferably, and as shown at 43, supported on cone bearings.

The planet wheels 17 supported torsion-tight on planet axle 11 and preferably axially slidable on it, are maintained spaced apart by spacer sleeves 45, which also can be slid over the planet axle 11. The guidance of the transfer toothed wheels 21, given a correspondingly narrow dimensioning of their center opening, can take place at the particular spacer sleeves 45. In the case of three and more associated moon systems, the transfer toothed wheels 21 can be guided through their moon drive wheels 29, which makes possible developing the center opening of the transfer toothed wheels 21 large [and thus] saving material and weight, and which further yields lower bearing friction.

If the wheels 21 are to be guided with a moon system, at least five moon systems are preferably provided on the particular planet wheel 17. Furthermore, if appropriate, support wheels 47 or slide supports (not shown) can be provided on the transfer toothed wheels 21 and/or planet wheels 17, in order to carry the transfer wheels.

A further constructional variant comprises connecting the planet wheels 17 torsionally tight with the spacer sleeves 45 and to employ the latter as bearing bushings for said transfer wheels 21.

In the embodiment according to FIG. 1 or FIG. 2 is evident, that at the onset of the sun rotation $\omega_s$ the moon systems are only set into characteristic rotation $\omega_m$ if the planet rotational motion $\omega_p$ has moved the particular stop brackets 25 on stops or longitudinal rods 27 or 35, respectively.

Figure 3:
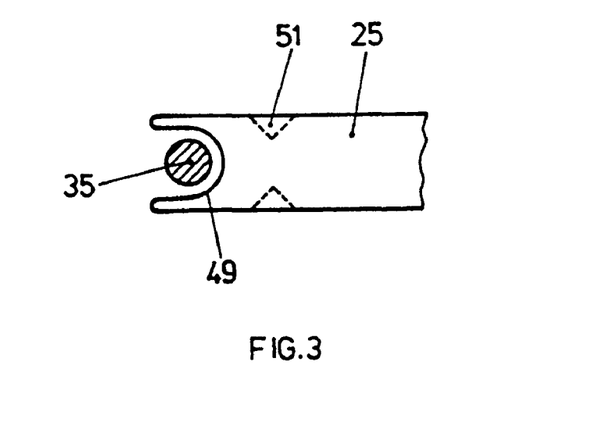

In FIG. 3, sectioned along line 3—3 of FIG. 2, a longitudinal rod 35 is depicted and the preferred shaping of the stop bracket 25 in its end region. With a U-form forming-in 49 the bracket 25 is supported so as to be rotation-tight on the longitudinal rod 35 acting as a stop 27, wherewith with the onset of the sun rotational motion $\omega_s$ the moon rotational motion $\omega_m$ also starts without delay.

The formation of the stop brackets 25 are adapted to different workpiece shapes and sizes or to the moon system layout.

As evident in FIG. 2, on the sun system optionally several planet systems with their axles 11 can preferably be provided, on the planet systems in each instance optionally several planet wheels 17 and on the latter optionally in each instance several moon systems, further on a drive 1 or in a chamber with respect to several workpiece supports 100.

In order to prevent in a possible blocking of a moon motion or a planet motion that the entire workpiece support according to the invention becomes jammed, on the workpiece support according to the invention, predetermined break points 51 can be included in order to limit the damage to as small as feasible a portion of the particular batch. Such predetermined break points preferably in the embodiment according to FIGS. 1 to 3, can be provided at the end portions of the stop brackets 25. By simply examining the particular stop brackets 25, it is possible to determine subsequently whether or not all moon systems were moved properly. To this end, the end regions of the stop brackets 25, breaking off at the predetermined break points 51, can be marked-such that they are visually noticeable, for example, they can be painted. It is also possible to provide there, for example, optoelectronic, capacitively or inductively or magnetically detectable parts, in order to monitor during operation the rotational motions in chamber 3.

A further checking feasibility of the proper functioning of the workpiece supports according to the invention is obtained by measuring the power consumed on driving motor 1. If one of the workpiece supports 100 according to the invention coupled to the drive motor 1 according to FIG. 1, is blocked with increasing load moment the consumed motor power increases. Therewith an alarm signal and/or an automatic switch-off can be triggered. In this way it is possible, in the event of damage, to interrupt in time the working of the batch, to correct the detected disturbance and subsequently to continue the working process at that point at which it had been interrupted.

Figure 4:
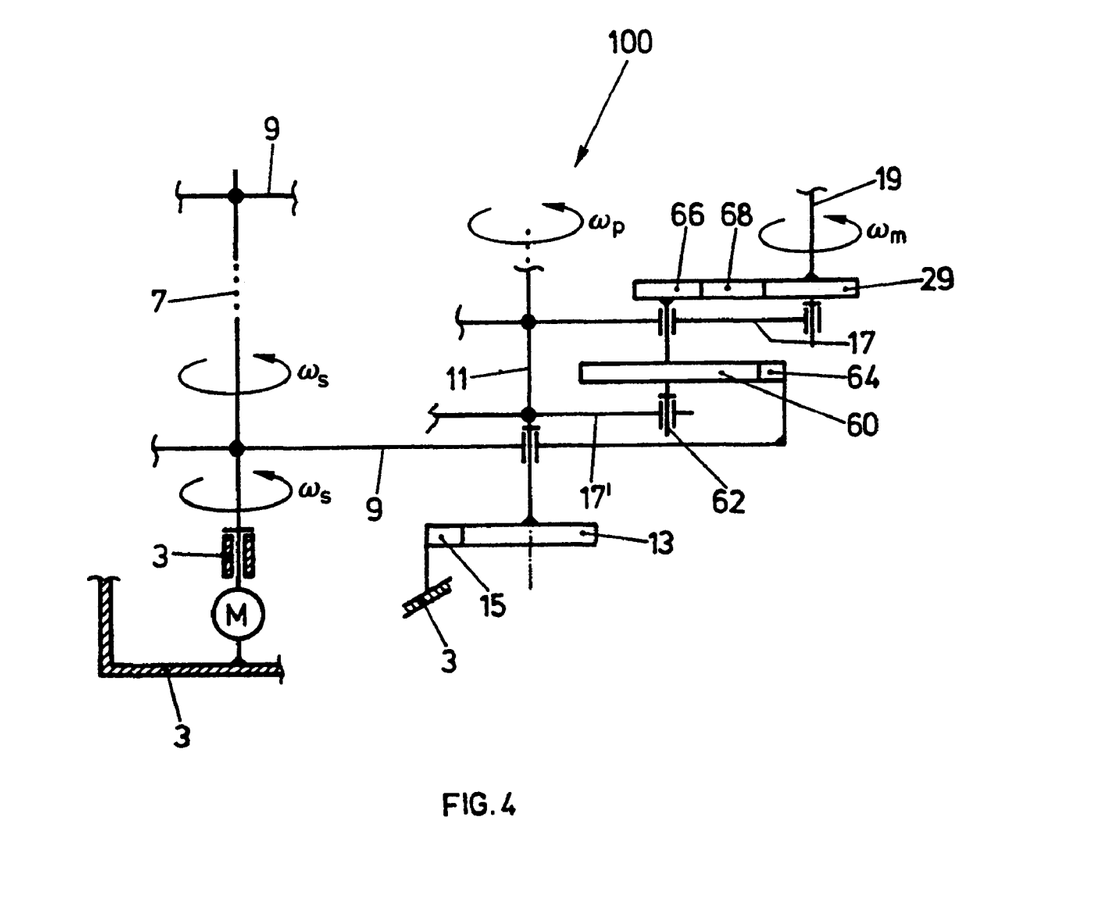

In FIG. 4, in a representation analogous to that of FIG. 1, a further embodiment variant of a workpiece support 100 according to the invention is shown schematically. The same reference symbols as in FIG. 1 are used for parts which are also provided in the embodiment according to FIG. 4.

Brackets 25 with transfer wheel 21 as well as stop 27 according to FIG. 1 are omitted. Instead, on an auxiliary planet wheel 17', for each moon system and with a rotational axle 62 parallel to the planet axle 11, a transfer wheel 60, preferably again a toothed wheel, is rotationally supported. The wheel 60 engages a transfer surface 64 (not shown) rotating coaxially about the planet axle 11—developed as a toothed wheel 60 and meshing with a wheel rim. A further transfer wheel 66, torsion-tight on the rotational axle 62, preferably a toothed wheel, engages a transfer ring 68 rotating coaxially about the planet axle 11, preferably developed as a ring with inner and outer toothing. The inner surface of the ring 68 is engaged by transfer wheel 66, the outer surface by moon drive wheel 29. The transfer ring 68 is frictionally supported on planet wheel 17. Through the corresponding dimension, in particular of the transfer wheels 66 and of the transfer ring 68, the moon rotational speed can be adapted according to the requirements. Therewith, the moon rotational motion $\omega_m$ can, for example, be set so slow that the workpieces provided therein are still treated, in particular coated, uniformly and on all sides, while simultaneously the moon system pivot bearings are subject to minimum wear.

Figure 5:
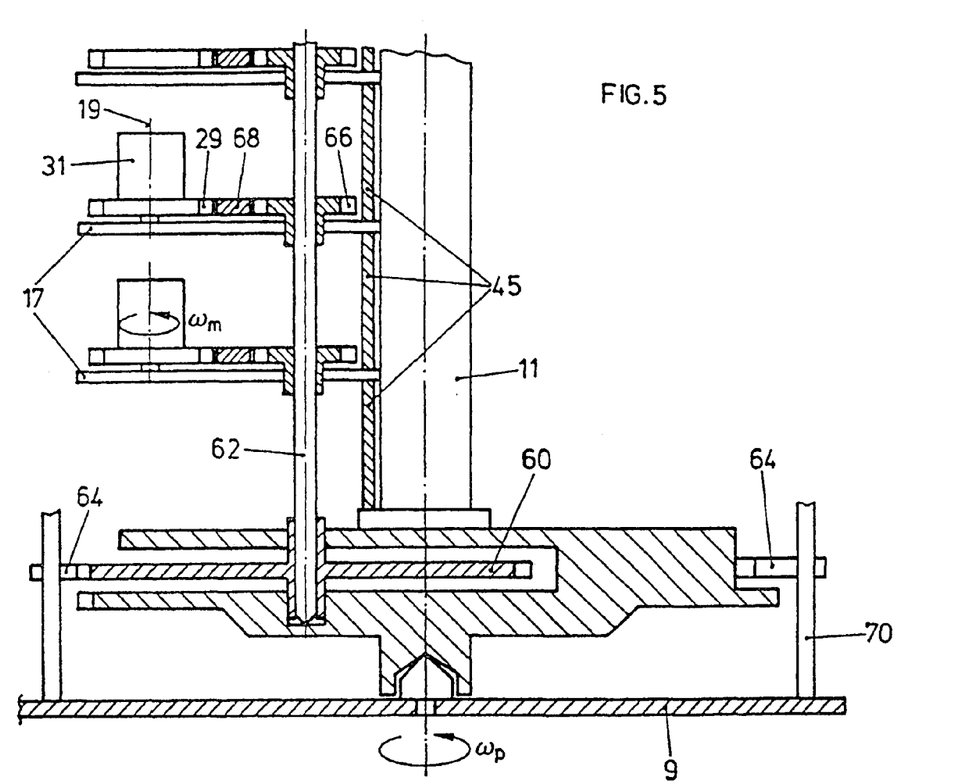

In FIG. 5 is depicted a realization of the variant, shown schematically in conjunction with FIG. 4, of a planet system workpiece support according to the invention. Furthermore, for already described parts the same reference symbols are used. In particular due to the use of the same reference symbols, the structure of the workpiece support according to FIG. 5 is readily evident based on the explanations in connection with FIG. 4.

Additionally is evident: the transfer surface 64 according to FIG. 4 is mounted as a ring with inner toothing on holding anchors 70, the latter being fixed on sun wheel 9.

Figure 6:
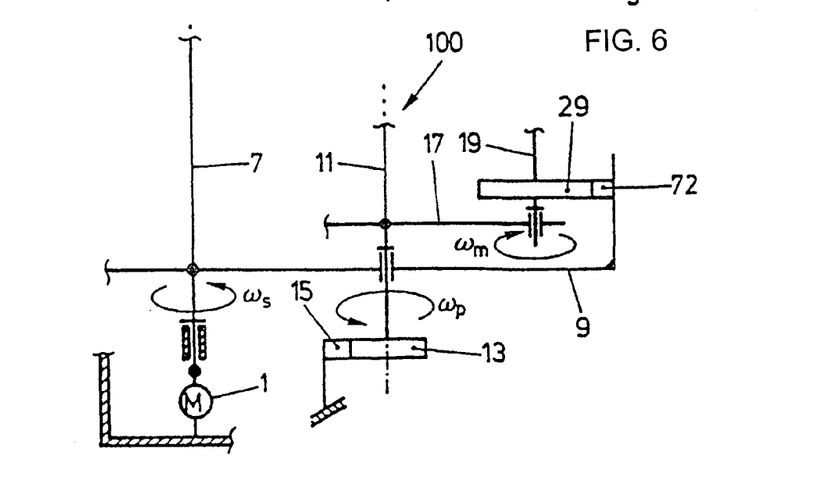

Following the procedure chosen so far, in FIG. 6, analogously to FIG. 1 or FIG. 4, the principle of a further embodiment variant of the workpiece support 10 according to the invention is shown, again schematically. Reference is made to the embodiment variant according to FIG. 1 or FIG. 2. In the embodiment according to FIG. 6, in view of FIG. 1, are again omitted transfer wheel 21, stop bracket 25, and stop 27. In their place, on sun wheel 9, an encircling transfer surface 72 is provided, preferably in the form of a ring with inner toothing revolving coaxially about planet axle 11 (not shown in FIG. 6). The moon drive wheel is in driving connection with the transfer surface 72. If the moon drive wheel 29 is a toothed wheel with outer toothing, it meshes with the toothing forming the transfer surface 72, of the ring disposed coaxially about the planet axle 11 on sun wheel 9.

In this case also through the corresponding dimensioning of the moon drive wheels 29 and the transfer surface 72, in particular their mutual toothing, the transmission ratio can be adjusted within a limited scope.

Figure 7:
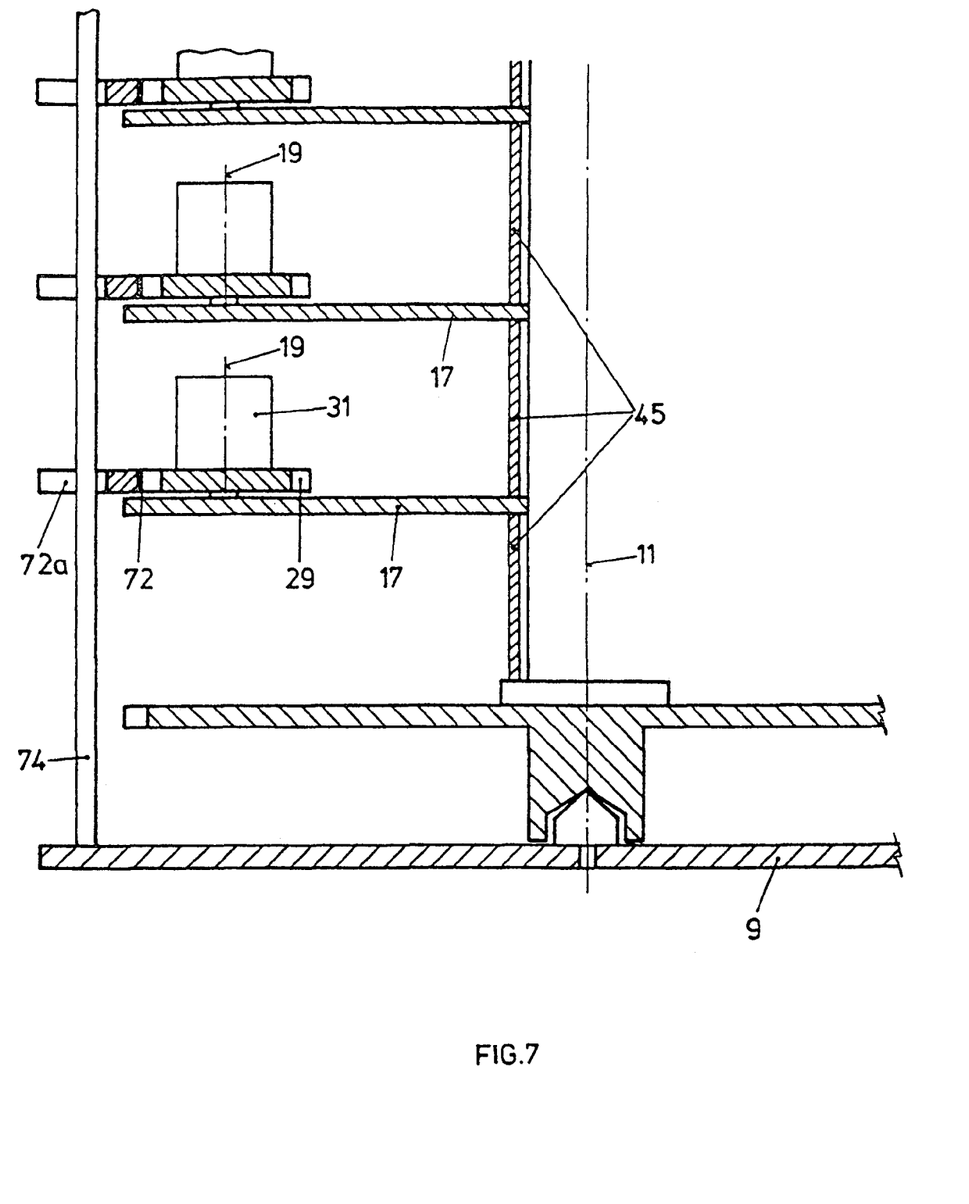

In analogy to FIGS. 2 and 5, in FIG. 7 a preferred embodiment of the workpiece support variant according to FIG. 6 is shown. Based thereon, it is evident that the transfer surface 72, in the form of the inner toothing of a toothed ring 72a, is supported in each case, on the level of the path of revolution of the moon drive wheels 29, on the sun wheel 9 by means of holding anchors 74.

The rings 72a, on holding anchors 74, held so that they are spaced apart, with (not shown) spacer bushings, can be placed onto these anchors. Therewith a fast ring mounting in the individual moon motion planes is possible.

In FIG. 8, again analogously to the procedure hitherto, the principle of a further embodiment variant is shown schematically of a planet system workpiece support according to the invention. Furthermore, the same reference symbols are applied to the same parts. With respect to FIG. 1, in the embodiment according to FIG. 8 again transfer wheel 21, stop bracket 25 and stop 27 are omitted. In their place, on the planet axle 11 an auxiliary planet wheel 17', preferably in the form of a toothed wheel, is provided, which engages or meshes with a transfer wheel 76, preferably again a toothed wheel. This drives a transfer axle 78 releasably rotationally supported on sun wheel 9, which carries at the level of the particular moon drive wheels 29 in each instance one output-side transfer wheel 80, again preferably in the form of a toothed wheel. Transfer wheel 80, on the one hand, and moon drive wheel 29, on the other hand, engage the inner, respectively outer, transfer surfaces 82/84 of a transfer ring 86, preferably engage the toothing. Ring 82 (shown in FIG. 9 spaced apart for reasons of clarity) is guided on the particular planet wheel 17 and extends coaxially about the planet axle 11. Again, through the corresponding dimensioning of the different transfers namely 17', 76, 80, 82 and 84 on 86, the transmission ratio between sun system rotational motion $\omega_s$ and moon system rotational motion $\omega_m$ can be set. The transfer wheels 80 as well as, if appropriate, the transfer ring 82 in batch processes, can be readily interchanged. The transfer wheels 80 can be slid torsion-tight onto the transfer axle 78, wherein between individual transfer wheels 80 in each instance spacer sleeves are slid over the transfer axle 78.

Figure 8:
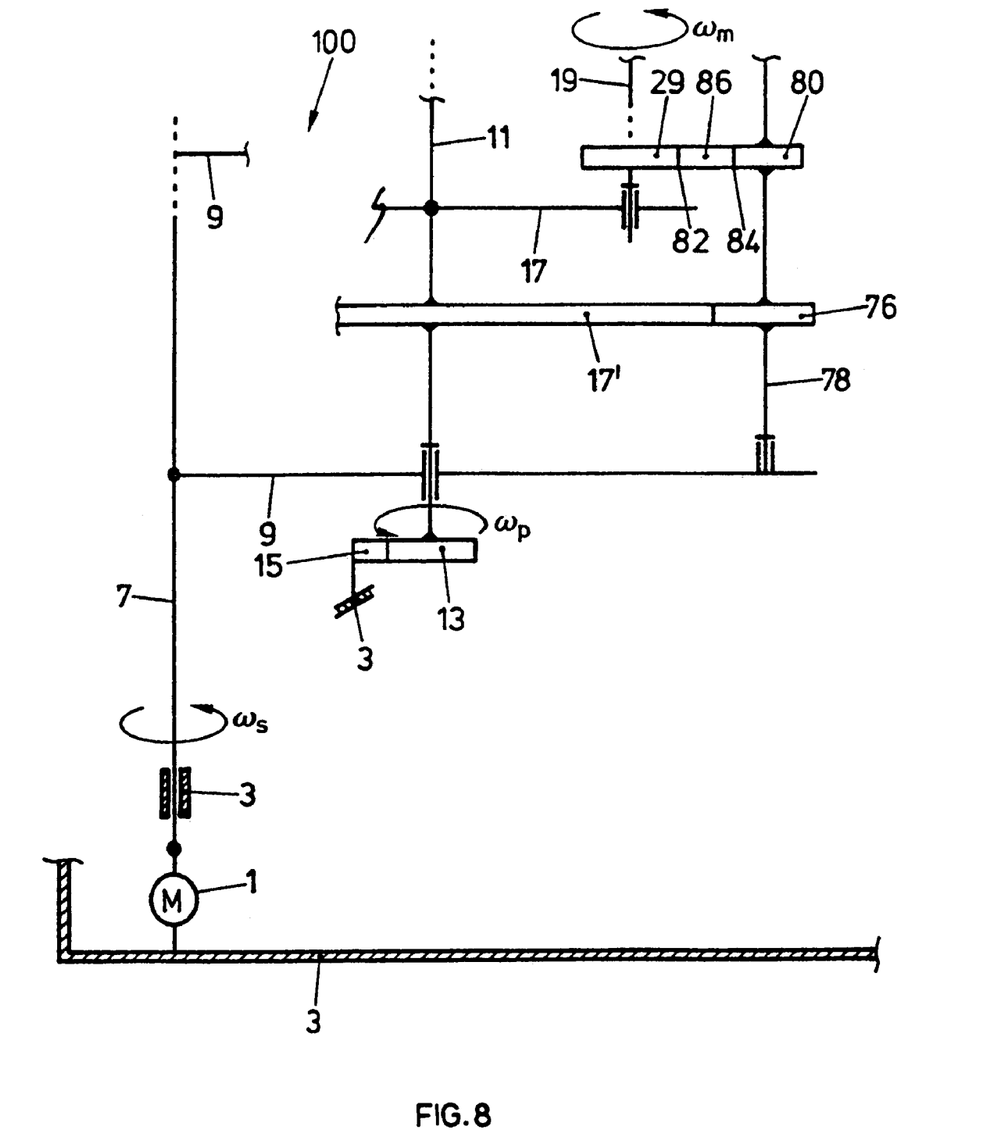
Figure 9:
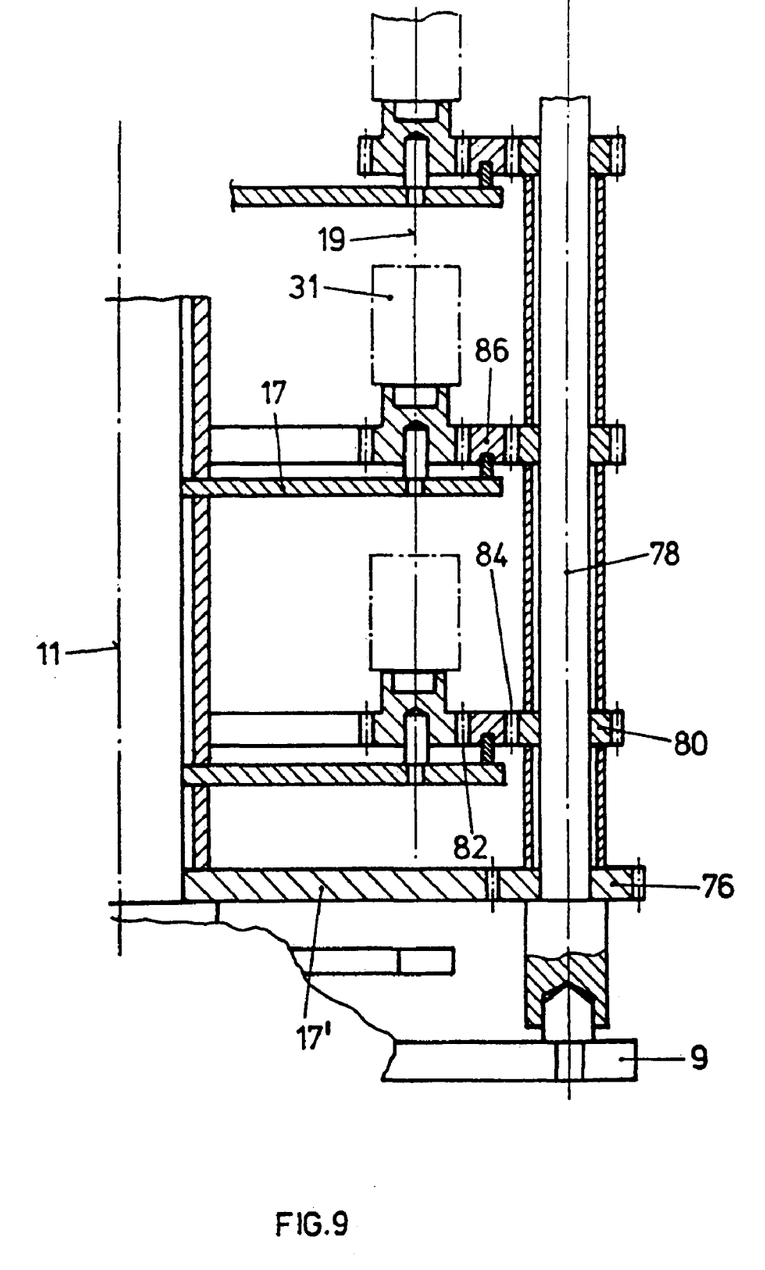

In FIG. 9, in analogy to FIGS. 2, 5 and 7, a preferred implementation is shown of the embodiment variant schematically explained in conjunction with FIG. 8, of the workpiece support according to the invention. Choosing the reference symbols used hitherto and those introduced in conjunction with FIG. 8, the structure and the operational function of the embodiment depicted in FIG. 9 is readily evident to a person skilled in the art.

Figure 10A:
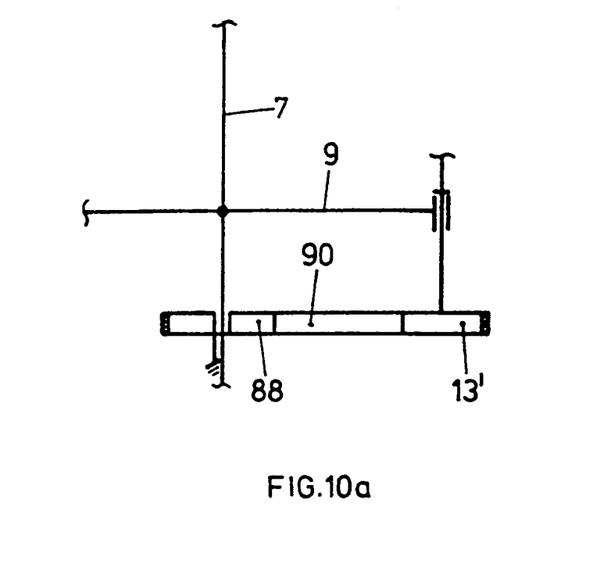
Figure 10B:
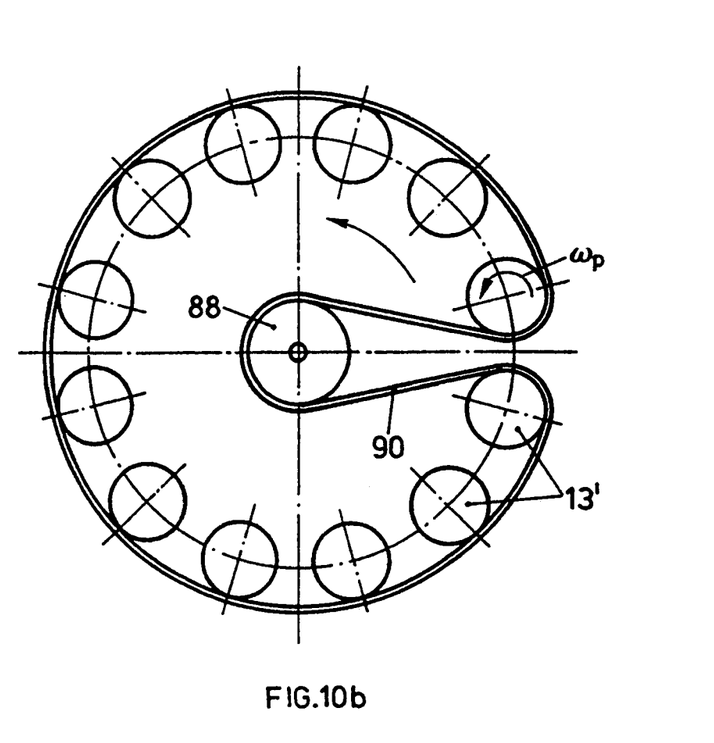

In FIG. 10 is depicted an especially simple, and thus preferred, embodiment variant of the drive connection between sun system and planet system, thus for example according to FIG. 1 acting between the sun axle 7 and the planet wheel 17. This configuration can be combined with all described further measures for rotational driving of the moon systems, but can also be employed with systems in which only one sun/planet system is realized, i.e. no rotating moon system.

According to FIG. 10a, continuing to apply the already introduced reference symbols, on the sun axle 7, as has been explained driven by a (here not shown) drive 1 disposed outside of the vacuum chamber, is supported the sun wheel 9. It carries, in turn rotationally supported thereon, the planet wheel 17, according to FIG. 1 (here not again depicted) as well as a planet drive wheel 13'. The sun axle 7 runs centrally through a stationary drive wheel 88. As is in particular evident based on the schematic top view of FIG. 10b, a drive belt element 90 revolves around the central stationary drive wheel 88 as well as around the provided planet drive wheels 13'. The rotational speed $\omega_p$ of the planet wheels is therein freely selectable or adjustable within a wide range via the diameter ratio of sun wheel 9 and planet drive wheel 13'. In this configuration the planet wheels 13' carry out a rolling motion on drive belt element 90.

With the aid of the planet system workpiece support a continuous rotational motion of the moon systems is ensured, which leads to a regular treatment uniform on all sides in particular also with short treatment times of workpieces, deposited on the moon systems, in a vacuum treatment installation, in particular in a coating installation.

| List of Reference Symbols ||
|---|---|
| 1 | Rotational drive |
| 3 | Wall, reference system |
| 5 | Coupling |
| 7 | Sun system axle |
| 9 | Sun wheel |
| 11 | Planet axle |
| 13 | Planet drive wheel |
| 13' | Planet drive wheel |
| 15 | Transfer ring |
| 17 | Planet wheel |
| 17' | Auxiliary planet wheel |
| 19 | Moon axle |
| 21 | Transfer wheel |
| 23 | Transfer wheel |
| 25 | Stop bracket |
| 27 | Stop |
| 29 | Moon drive wheel |
| 31 | Workpiece holder |
| 33 | Longitudinal rods |
| 35 | Longitudinal rods |
| 37 | Spokes |
| 39 | Spokes |
| 41 | Pin bearing |
| 43 | Cone bearing |
| 45 | Spacer sleeves |
| 47 | Support wheels |
| 49 | Forming-in |
| 51 | Predetermined break |
| 60 | Transfer wheel |
| 62 | Rotational axle |
| 64 | Transfer surface |
| 66 | Transfer wheel |
| 68 | Transfer ring |
| 70 | Holding anchor |
| 72 | Transfer surface |
| 72a | Transfer surface |
| 74 | Holding anchor |
| 76 | Transfer wheel |
| 78 | Transfer axle |
| 80 | Transfer wheel |
| 82/84 | Transfer surfaces |
| 86 | Transfer rings |
| 88 | Drive wheel |
| 90 | Drive belt element |
| 100 | Workpiece support |

What is claimed is:

1. A vacuum treatment planet system workpiece support for vacuum treatment installation, comprising:
   a sun system (9, 9') rotatable with respect to the installation about a sun system axis (7) which can be coupled to a drive (1), the sun system having a sun wheel (9);
   at least one planet system (17, 17') rotatably coupled to said sun system to rotate about said sun system axis (7) and rotatable about a planet axis (11) and having a driving coupling (15, 13) for driving the planet system about said planet axis; and
   at least one moon system (29, 31) supported on the planet system (17) and rotatable about a moon axis (19) and having a driving connection to the sun system (7, 9, 9');
   said moon system having at least two moon wheels (29) staggered one upon the other along said moon axis (19) and mutually distant, each of said moon wheels (29) having a receiver for at least one workpiece, and wherein the driving connection of said moon system to said sun system, at least during operation, is established uninterruptedly.

2. The system of claim 1, wherein said driving connection to said sun system is a forced driving connection.

3. The system of claim 2, wherein said driving connection to said sun system is a toothing driving connection.

4. The system of claim 1, wherein said driving connection to said sun system comprises a transfer configuration (21; 60, 66, 68; 76, 80, 86) freely rotatable about said planet axis (11) and engaging under transfer on the one hand said sun system (27; 64; 72; 76) and on the other hand said moon system (29).

5. The system of claim 1, wherein said driving connection to said sun system comprises a transfer wheel (21) freely rotatable about said planet axis (11) and engaging a transfer wheel (29) of the moon system and having a rotational detent (25) acting onto a stop (27) on the sun system (9).

6. The system of claim 1, wherein said driving connection to said sun system comprises a transfer ring surface disposed coaxially to the sun axis (64, 72) on the sun system (9), in engagement with a transfer wheel (60, 29) of the moon system.

7. The system of claim 1, wherein said driving connection to said sun system comprises a transfer wheel (60, 76) rotatably supported on said planet system (9), which via a further transfer wheel (66, 80) and a transfer ring (68, 86) revolving about the planet axis (11), is in rolling engagement with a transfer wheel (29) of the moon system.

8. The system of claim 1, wherein a planet wheel (17') drives a transfer axle (78) which is rotatably supported on the sun wheel (9), and that the transfer axle (78) via a further transfer wheel (80) as well as a transfer ring (86) revolving about the planet axle (11), is in rolling engagement with a transfer wheel (29) of the moon system.

9. the system of claim 1, wherein at least one of said drive of said sun system, said driving coupling of said planet system and of said driving connection comprises at least one predetermined break point (51).

10. The system of claim 1, wherein said sun system axle (7) is guided through a stationary drive wheel (88) and a belt drive (90) wraps around the drive wheel (88) and a drive wheel (13') on the planet system.

* * * * *